United States Patent
Kim et al.

(10) Patent No.: US 9,667,273 B2
(45) Date of Patent: May 30, 2017

(54) APPARATUS AND METHOD FOR CORRECTING ERROR IN MOBILE COMMUNICATION SYSTEM USING NON-BINARY LOW-DENSITY PARITY-CHECK CODES

(71) Applicant: Samsung Electronics Co., Ltd., Gyeonggi-do (KR)

(72) Inventors: Sang-Min Kim, Gyeonggi-do (KR); Woo-Myoung Park, Gyeonggi-do (KR); Chi-Woo Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 14/656,477

(22) Filed: Mar. 12, 2015

(65) Prior Publication Data

US 2015/0263763 A1  Sep. 17, 2015

(30) Foreign Application Priority Data

Mar. 12, 2014 (KR) ........................ 10-2014-0029070

(51) Int. Cl.
*H03M 13/00* (2006.01)
*H03M 13/11* (2006.01)
*H03M 13/37* (2006.01)

(52) U.S. Cl.
CPC ... *H03M 13/1171* (2013.01); *H03M 13/3707* (2013.01); *H03M 13/658* (2013.01)

(58) Field of Classification Search
CPC combination set(s) only.
See application file for complete search history.

(56) References Cited

U.S. PATENT DOCUMENTS

| | | | |
|---|---|---|---|
| 8,438,461 B2* | 5/2013 | Varnica | H03M 13/112 714/774 |
| 8,468,438 B2 | 6/2013 | Heinrich et al. | |
| 8,607,115 B2* | 12/2013 | Gunnam | H03M 13/1111 714/752 |
| 2010/0042897 A1* | 2/2010 | Han | H03M 13/1111 714/752 |
| 2013/0283119 A1 | 10/2013 | Heinrich et al. | |

OTHER PUBLICATIONS

B. Shin, S. H. Kim, J. S. No and D. J. Shin, "New stopping criteria for decoding LDPC codes in H-ARQ systems," Information Theory and Its Applications, 2008. ISITA 2008. International Symposium on, Auckland, 2008, pp. 1-5. doi: 10.1109/ISITA.2008.4895538.*

* cited by examiner

*Primary Examiner* — Justin R Knapp

(57) ABSTRACT

Various embodiments of the present disclosure adjusts the size (nm) of a message input to a corresponding check node in case the unsatisfied check equation increases as the iteration count increases.
Another embodiment of the present disclosure relates to a method for selecting a message and grasps the data distribution characteristics of the message vector values converted using the signal to noise ratio (SNR) and modulation and coding scheme (MCS) parameters of the receiver to select the message value with a value smaller than the threshold value in each message vector.

18 Claims, 15 Drawing Sheets

| iteration | (case 1) | iteration | (case 2) | iteration | (case 3) |
|---|---|---|---|---|---|
| 1 | 248 | 1 | 248 | 1 | 280 |
| 2 | 219 | 2 | 220 | 2 | 234 |
| 3 | 208 | 3 | 183 | 3 | 227 |
| 4 | 181 | 4 | 174 | 4 | 212 |
| 5 | 174 | 5 | 142 | 5 | 201 |
| 6 | 173 | 6 | 132 | 6 | 178 |
| 7 | 138 | 7 | 105 | 7 | 149 |
| 8 | 109 | 8 | 78 | 8 | 152 |
| 9 | 80 | 9 | 39 | 9 | 119 |
| 10 | 69 | 10 | 28 | 10 | 91 |
| 11 | 49 | 11 | 17 | 11 | 67 |
| 12 | 34 | 12 | 6 | 12 | 47 |
| 13 | 24 | 13 | 2 | 13 | 25 |
| 14 | 19 | 14 | 0 | 14 | 24 |
| 15 | 10 | | | 15 | 10 |
| 16 | 10 | | | 16 | 5 |
| 17 | 3 | | | 17 | 2 |
| 18 | 2 | | | 18 | 2 |
| 19 | 0 | | | 19 | 0 | the number of unsatisfied parity-check equations

FIG.6

| iteration | 910 | 920 | 930 |
|---|---|---|---|
| 1 | 251 | 249 | 264 |
| 2 | 217 | 212 | 215 |
| 3 | 183 | 188 | 165 |
| 4 | 191 | 156 | 161 |
| 5 | 170 | 117 | 136 |
| 6 | 145 | 83 | 124 |
| 7 | 121 | 54 | 94 |
| 8 | 91 | 20 | 77 |
| 9 | 86 | 9 | 62 |
| 10 | 64 | 6 | 44 |
| 11 | 54 | 4 | 54 |
| 12 | 36 | 0 | 43 |
| 13 | 23 | | 34 |
| 14 | 12 | | 26 |
| 15 | 9 | | 14 |
| 16 | 2 | | 10 |
| 17 | 2 | | 8 |
| 18 | 0 | | 6 |
| 19 | | | 4 |
| 20 | | | 2 |

912 → rows 3–4 of column 910; 932 → rows 10–11 of column 930

FIG.9

APPARATUS AND METHOD FOR CORRECTING ERROR IN MOBILE COMMUNICATION SYSTEM USING NON-BINARY LOW-DENSITY PARITY-CHECK CODES

CROSS-REFERENCE TO RELATED APPLICATION AND CLAIM OF PRIORITY

The present application is related to and claims the benefit under 35 U.S.C. §119(a) of a Korean patent application filed in the Korean Intellectual Property Office on Mar. 12, 2014 and assigned Serial No. 10-2014-0029070, the entire disclosure of which is incorporated herein by reference.

TECHNICAL FIELD

The present disclosure relates to an apparatus and method for correcting errors in a mobile communication system using a non-binary low-density parity-check LDPC) codes.

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FOAM) and sliding window superposition coding (SWSC) as an advanced coding modulation (ACM), and filter bank multi carrier (FBMC), non-orthogonal multiple access (NOMA), sparse code multiple access (SCMA), and Low-Density Parity-Check (LDPC) coding as an advanced access technology have been developed.

BACKGROUND

A typical mobile communication system uses an encoder and a decoder to correct errors in forward channels. Mobile communication systems perform data transmission and reception in a wireless environment, and in order to effectively correct errors that occurs due to noise in a transmission channel to increase the reliability of data transmission, the mobile communication systems adopt Trellis codes, such as convolutional codes, or linear block codes, such as Reed-Solomon (R-S) codes. Turbo codes were introduced by Berrou in 1993, along with an iterative decoding scheme with near Shannon limit error-correcting capabilities. The iterative decoding scheme may guarantee more reliable communication than existing convolutional code decoding does.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide an error correction appliance and method that applies a variable offset value depending on a variable channel environment and transmission data characteristics to allow for efficient management in light of performance and complexity.

The present disclosure provides an error correction appliance and method that allows for efficient error correction and reduced error flow in case the number of unsatisfied check nodes increases due to the increase in the count of iterative decoding by the iteration decoder.

According to various embodiments of the present disclosure, a method for correcting an error in a mobile communication system using a non-binary LDPC code comprises: receiving a signal transmitted from a transmitter; and performing iterative decoding on the received signal, wherein the performing the iterative decoding includes: counting the number of unsatisfied check nodes according to the increase in an iterative decoding count; and when the number of the unsatisfied check nodes is a predetermined number, adjusting the size of messages input to the unsatisfied check nodes.

According to various embodiments of the present disclosure, an apparatus for correcting an error in a mobile communication system using a non-binary LDPC code comprises: a counter counting the number of unsatisfied checks according to the increase in an iterative decoding count; and a controller adjusting the size of messages input to the unsatisfied check nodes when the number of the unsatisfied check nodes is a predetermined number.

The present disclosure applies a variable offset value depending on a variable channel environment and transmission data characteristics to allow for efficient management in light of performance and complexity.

The present disclosure allows for efficient error correction and reduced error flow in case the number of unsatisfied check nodes increases due to the increase in the count of iterative decoding by the iteration decoder.

The present disclosure reduces decoding failure and average iteration count.

The present disclosure reduces the power consumption of the receiver by decreasing the average iteration count.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 6 and 7, respectively, illustrate typical examples of decoding success or failure using a constant nm according to various embodiments of the present disclosure;

FIG. 9 illustrates an example of adjusting nm when the maximum iterative decoding count equals 20 according to various embodiments of the present disclosure;

Throughout the drawings, like reference numerals will be understood to refer to like parts, components, and structures.

DETAILED DESCRIPTION

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications system. Hereinafter, embodiments of the present disclosure are described in detail with reference to the accompanying drawings. It should be noted that the same reference denotations can be used to refer to the same or substantially the same elements throughout the specification and the drawings. When making the gist of the present disclosure unclear, the detailed description of known functions or configurations is skipped.

The terms or words as used herein should be interpreted, rather than in typical or dictionary definitions, in compliance with the technical spirit and concept of the present disclosure as per the principle that the inventor properly defines the terms in order to describe his disclosure in a best way as possible.

A first embodiment of the present disclosure proposes a method for adjusting the size of a corresponding check node input vector message, the number of messages (nm), when an unsatisfied check equation increases due to the increase in the iteration count. Hereinafter, "increases in unsatisfied check equations" can also be referred to as the "number of the increases in checks," "increases in unsatisfied checks," or "increases in the number of unsatisfied check nodes."

A second embodiment of the present disclosure relates to a method by which a message is selected. The data distribution characteristics of the message vector values converted using the signal to noise ratio (SNR) and modulation and coding scheme (MCS) parameters of the receiver are grasped to select the message value with a value smaller than the threshold value in each message vector. Further, when the size of the selected message is a predetermined nm value (nm=6), the threshold value is increased and a message is selected.

The threshold value is determined depending on at least one of the MCS index and the SNR parameter.

Figure 1:
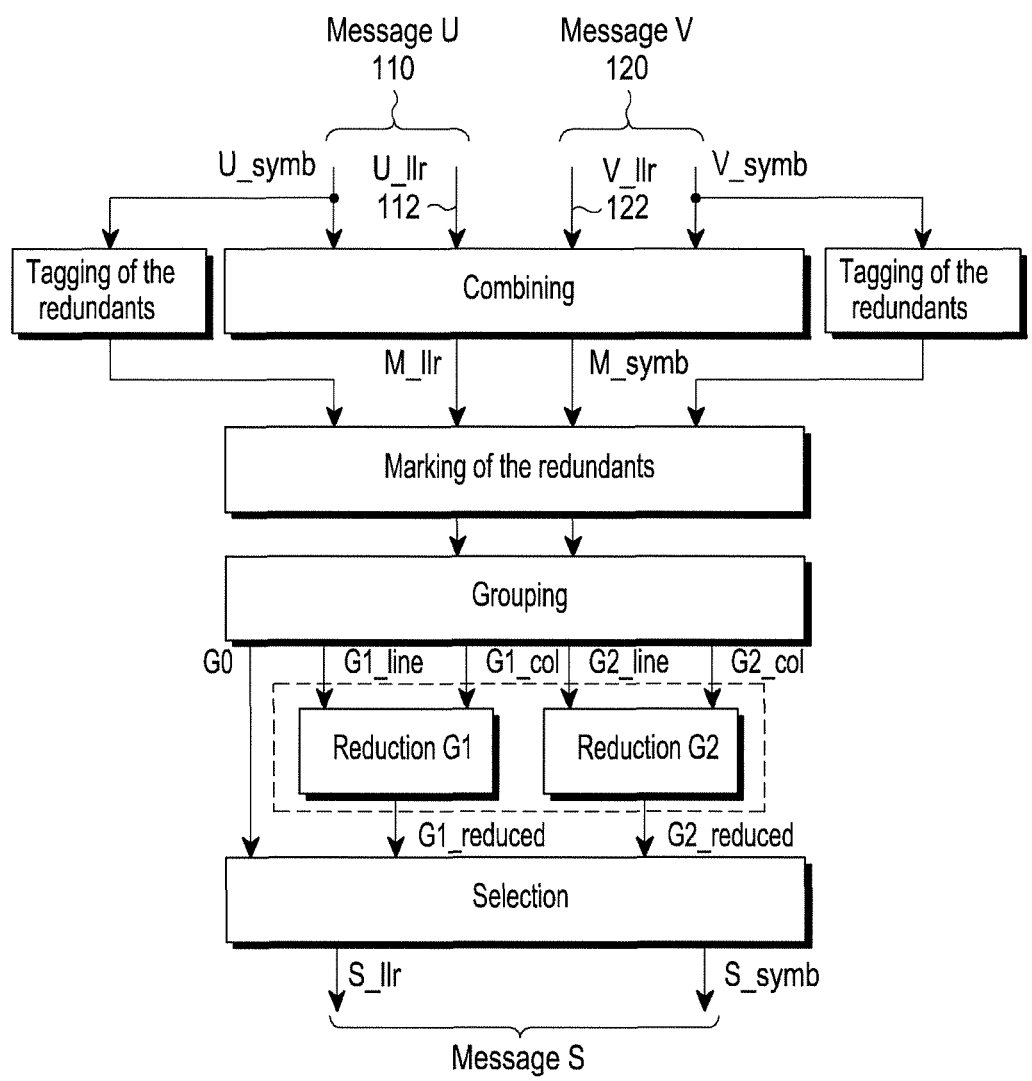
FIG. 1 illustrates the internal configuration of a check node of a non-binary LDPC code decoder according to various embodiments of the present disclosure.

FIG. 1 illustrates the internal configuration of a check node of a non-binary LDPC code decoder according to various embodiments of the present disclosure.

A sorting algorithm is typically used to sort, in order, message values for the vectors (such as U_llr 112 and V_LLr 122) of input messages U 110 and V 120. The sorting algorithm refers to an algorithm that linearly sorts values in order of size. The sorted messages are input to check nodes or variable nodes using message symbols and message value that is smaller in vector size than the received input messages and are respectively subjected to decoding computation by the nodes.

Among the sorting methods adopted in the non-binary LDPC code decoding algorithms, the scheme of computing the messages in the decoder consumes excessive time for decoding and is thus disadvantageous to systems requiring high-speed data processing. Accordingly, the sorting scheme does not fit the receiver for next-generation base stations or terminals requiring quick data processing.

Figure 2:
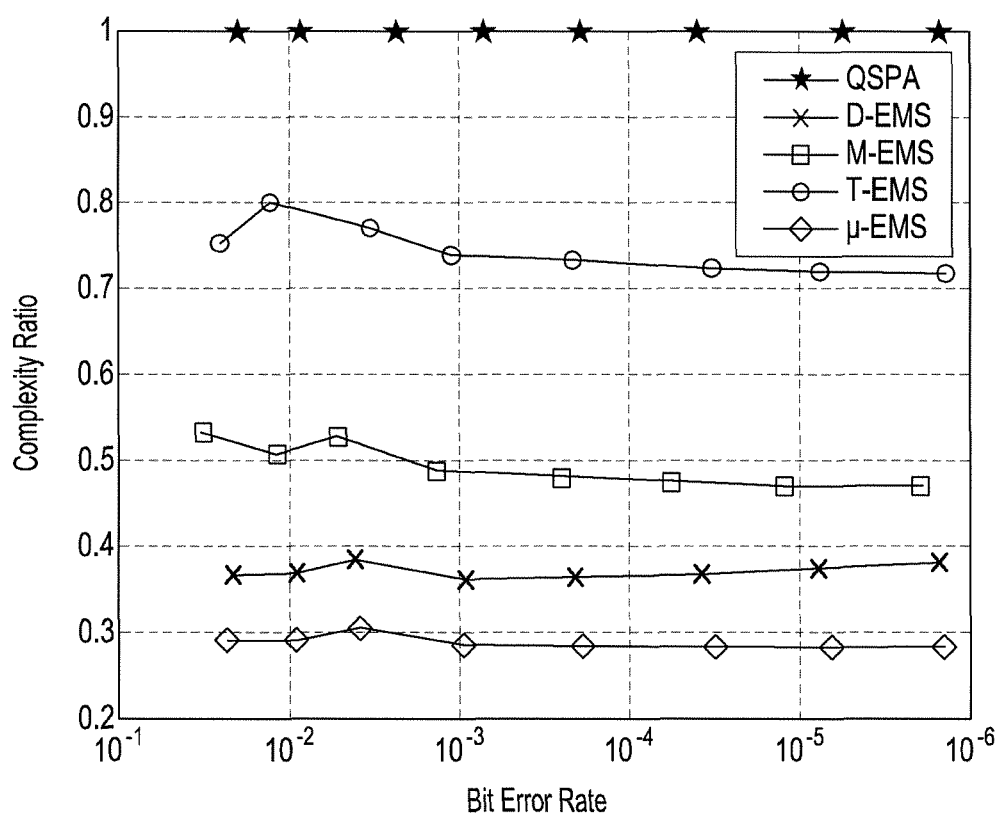
FIG. 2 illustrates a graph comparing GF 64 non-binary LDPC code decodes in light of complexity according to various embodiments of the present disclosure.

FIG. 2 illustrates a graph comparing GF 64 non-binary LDPC code decodes in light of complexity ratio according to various embodiments of the present disclosure.

A complexity ratio of a GF 64 non-binary LDPC code decoder is represented by sorting in order messages values using the mean value and offset values of the message vectors. The message symbols and message values that have different message vectors as per the mean value of the message vectors are input to the check nodes or the variable nodes.

The non-binary LDPC code decoder evenly cuts (or hereinafter referred to as "truncates") the received messages without considering the check nodes or variable nodes corresponding to the trapping sets that are the cause of an error floor, resulting in performance deterioration.

The scheme of sorting in order the message values using the mean value and offset values of the message vectors in the non-binary LDPC code decoder features selectively choosing the messages as per probability distributions of the messages. In other words, the scheme of sorting in order the message values means sorting the message values and symbols with different sizes from each message vectors depending on the reliability of the received messages. However, such scheme utilizes the fixed offset values regardless of the data and channel characteristics of the received data and fails to provide efficient management in light of performance and complexity under the environment of variable channel characteristics and diverse data characteristics (including modulation and coding scheme).

Further, the sorting algorithm scheme does not live up to systems requiring high-speed data processing. The scheme of selecting a higher value as an input to the check node upon evaluating the reliability of messages includes the characteristic that it increases the number of bits in an internal message. Accordingly, the increase in the number of bits in the internal message leads to an increased complexity of the decoder.

The present disclosure addresses the following issues in order to equip the conventional decoder for non-binary LDPC code decoding/encoding transmitters or receivers, particularly receivers, with the functions that the prior art do not.

The first embodiment of the present disclosure reduces error flow by adjusting the size (nm) of vector messages input to their respective corresponding check nodes and the offset values when the unsatisfied check equations increase as the iteration count increases in the decoder adopting an iterative decoding algorithm.

The decoding technique is a method that uses fixed offset values irrespective of the characteristics of received data or channel characteristics. In order to address the performance (error correction capability) deterioration under the variable channel environment and the characteristics of data transmitted, the present disclosure applies offset values that vary depending on the variable channel environment and the characteristics of data transmitted and enhances the performance.

The second embodiment of the present disclosure increases the threshold value and selects a message in a feedback process when the size of a selected message is not more than a specific n value (n=6). This prevents the occurrence of the case where the size of the selected message is small when the channel has increased noise and many of the long likelihood ratio (LLR) values are similar to each other.

Figure 3:
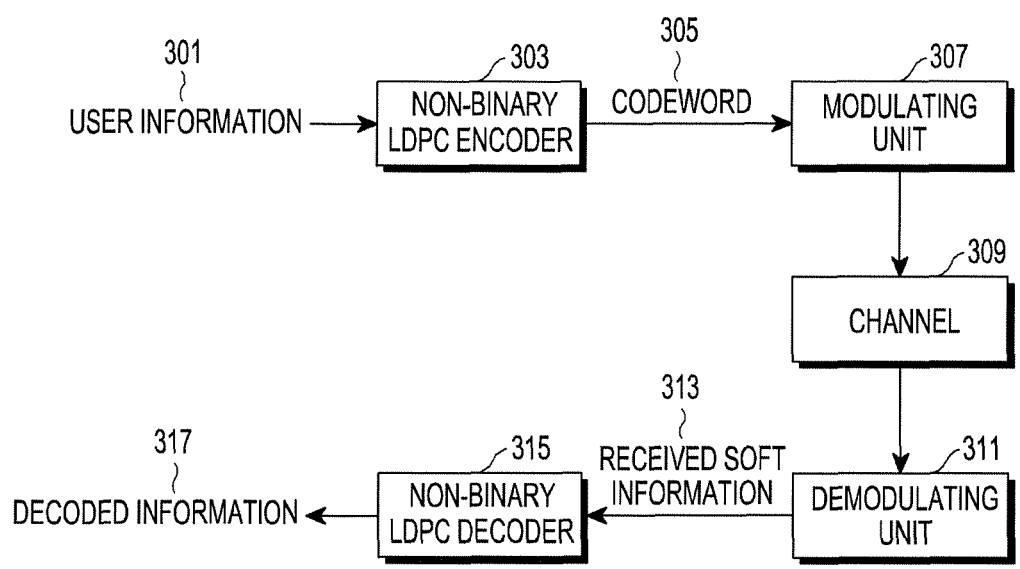
FIG. 3 illustrates a transmitter and a receiver having non-binary LDPC codes according to various embodiments of the present disclosure.

FIG. 3 illustrates a transmitter and a receiver having non-binary LDPC codes according to various embodiments of the present disclosure.

A non-binary LDPC encoder 303 generates a codeword 305 using a non-binary LDPC code and user data (or user information 301). The length of the codeword is determined depending on the non-binary LDPC code. The LDPC code is typically represented in the form of an M row-N column parity-check matrix (referred to as an "H matrix"). Accordingly, the length of the codeword 305 is N (unit: symbols). The generated codeword 305 is transferred to a modulator 307. The modulator 307 modulates the codeword 305 in a modulating scheme (such as 16 Quadrature Amplitude Modulation (QAM), 64 QAM, or Frequency Quadrature Amplitude Modulation (FQAM) and transmits the modulated codeword 305 to the demodulator 311 of a base station or receiver via a channel 309. The demodulator 311 computes the soft information 313 of the message corresponding to the codeword length N in the form of a message vector and transmits the result to a non-binary LDPC decoder 315.

For example, in the case of a GF(4)={0, 1, $\alpha$, $\alpha^2$} LDPC code and QPSK modulation, the soft information 313 of the receiver is represented as the following message vector, for example, a vector value with a probability or reliability value, {Probability[0], Probability[1], Probability[$\alpha$], Probability[$\alpha^2$]}. Accordingly, the received N-long data is configured by the demodulator 311 as N message vectors, such as a first symbol {Probability[0], Probability[1], Probability[$\alpha$], Probability[$\alpha^2$]}, a second symbol {Probability[0], Probability[1], Probability[$\alpha$], Probability[$\alpha^2$]}, ..., Nth symbol {Probability[0], Probability[1], Probability[$\alpha$], Probability[$\alpha^2$]}. The non-binary LDPC decoder 315 performs a decoding process on the input N message vectors and outputs a K-long message, where K=N−M. The K-long message (K=N−M) means the decoded information 317 as shown in FIG. 3.

Figure 4:
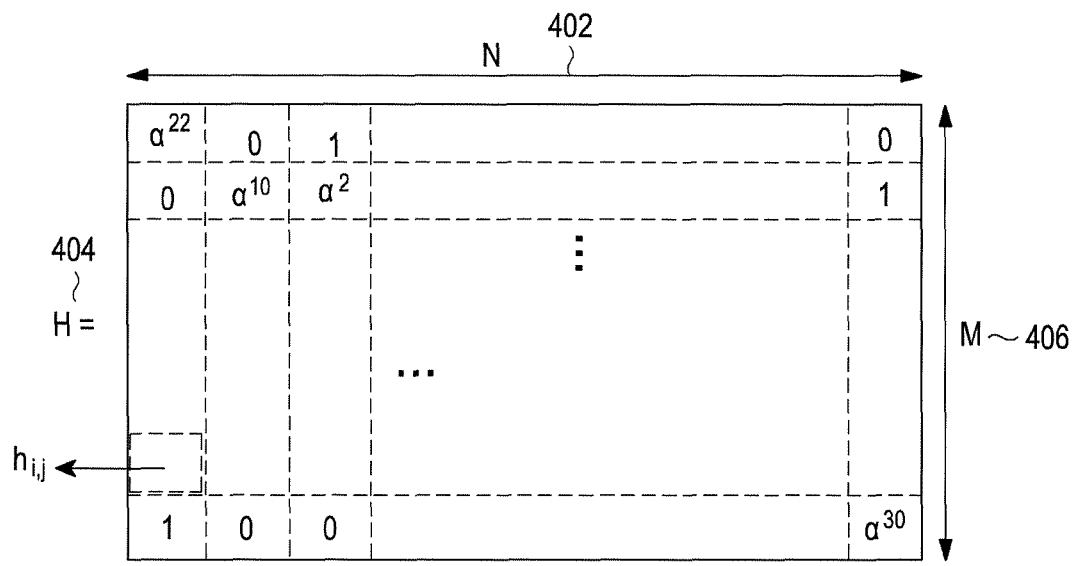
FIG. 4 illustrates an exemplary non-binary LDPC code in the case of GF 32 according to various embodiments of the present disclosure.

FIG. 4 illustrates an exemplary non-binary LDPC code in the case of GF 32 according to various embodiments of the present disclosure.

An encoder and a decoder are configured with non-binary LDPC codes and a non-binary LDPC code is typically represented in the form of a check code matrix (H) 404. The size of the H 404 is M×N, where N 402 is the length of codeword, and M 406 is the length of parity (or redundancy) or the number of parity symbols, which are represented as the length K of user information, such as K=N−M. The elements of H 404, when determined by the GF(q) LDPC code, are represented as symbol elements, $h_{i,j}$={0, 1, $\alpha$, ..., $\alpha^{q-2}$}.

Figure 5:
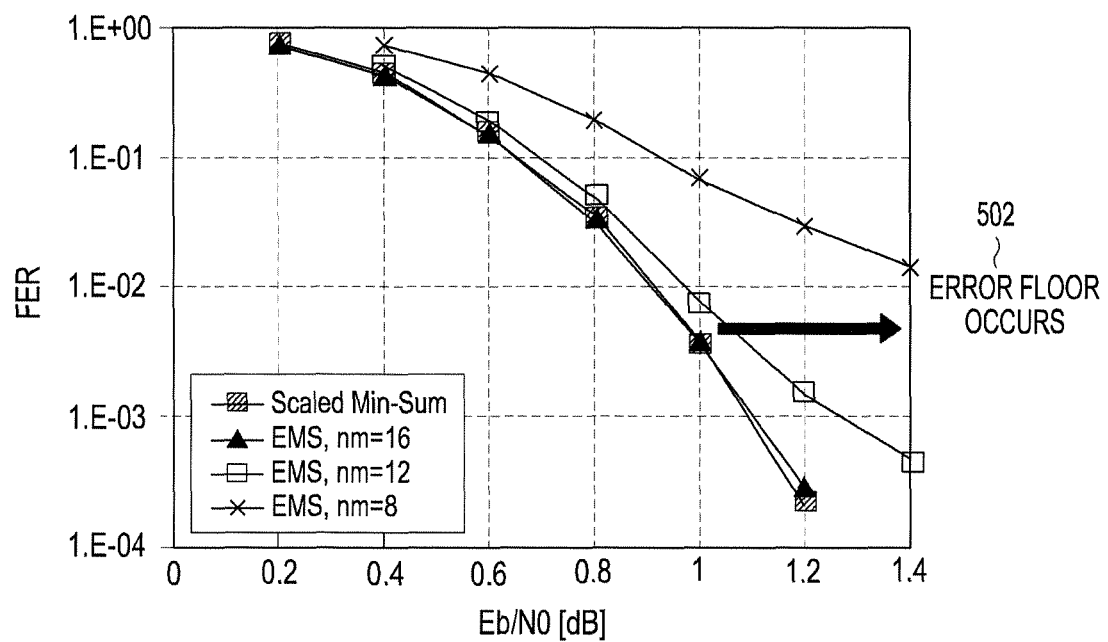
FIG. 5 illustrates a graph comparing decoding performances depending on a varying nm value according to an embodiment of the present disclosure.

FIG. 5 illustrates a graph comparing decoding performances depending on a varying nm value according to an embodiment of the present disclosure.

FIG. 5 illustrates the decoding performances depending on the varying nm in the case of GF 32, iteration count=35, K=960 bits, and code rate=1/3.

In the graph illustrated in FIG. 5, nm denotes the number of messages, and EMS denotes an extended min-sum algorithm.

Reference numeral 502 shows, as nm decreases, an error flow is more likely to occur. FIG. 5 also shows that nm is fixed regardless of whether SNR varies and performance deterioration arises early under the good channel state. FIG. 5 shows that performance deterioration occurs upon truncating the messages without consideration of code design or SNR.

Figure 7:
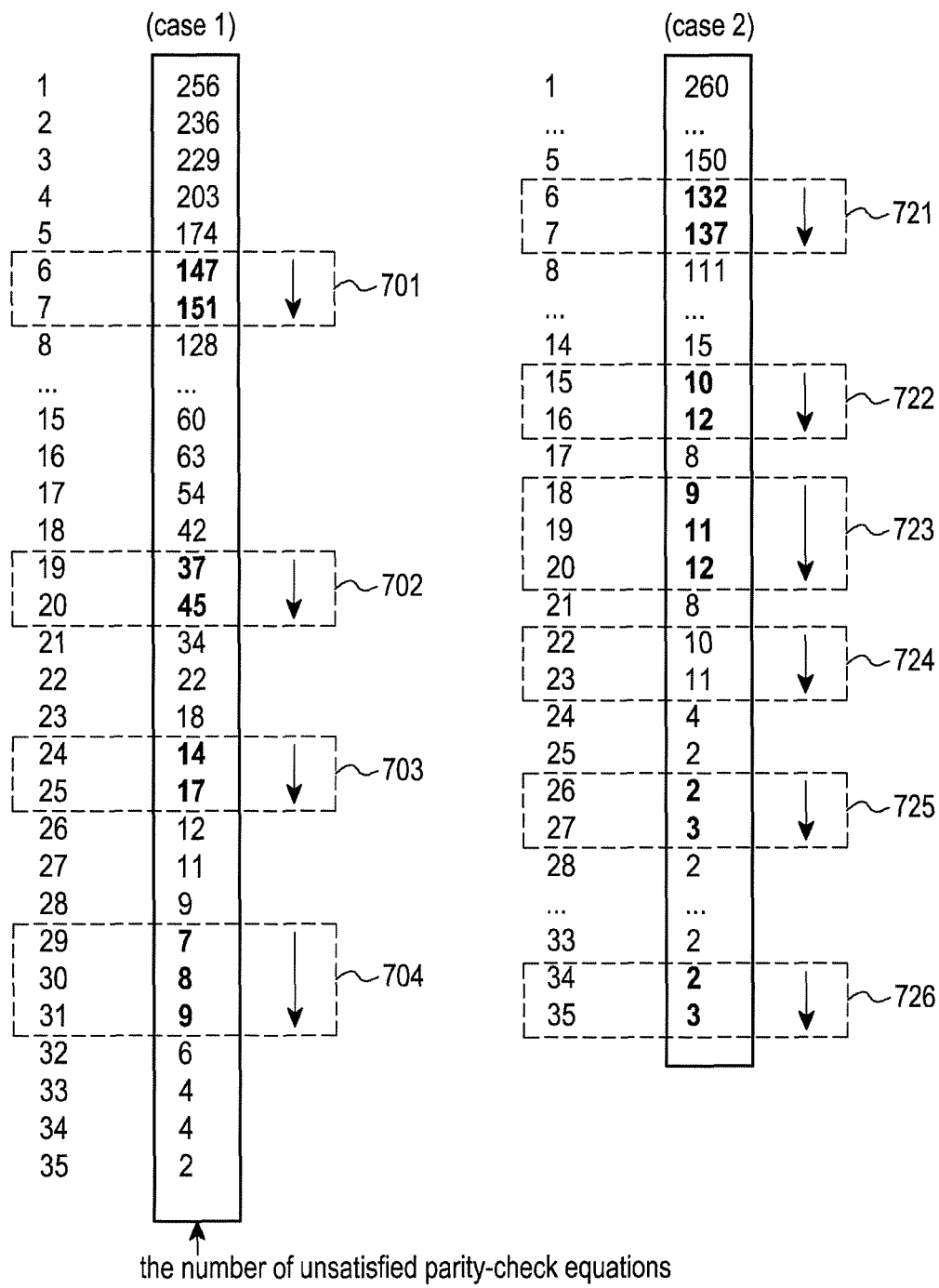

FIGS. 6 and 7, respectively, illustrate typical examples of decoding success or failure using a constant nm.

FIG. 6 illustrates an example where decoding succeeds when the maximum iteration count=35, M=384, and code rate=1/3.

Referring to FIG. 6, case 1 600 and case 2 620 do not exhibit the increase in unsatisfied checks. In contrast, case 3 of FIG. 6 shows a single occurrence of the increase in unsatisfied checks as indicated by reference numeral 642.

FIG. 7 illustrates an example where decoding fails when the maximum iteration count=35, M=384, and code rate=1/3.

Case 1 700 of FIG. 7 exhibits four (such as the number of the increases in unsatisfied checks) increases in unsatisfied checks as marked by reference numerals 701, 702, 703, and 704. In case 2 720 of FIG. 7, there are six increases in unsatisfied checks as marked by reference numerals 721, 722, 723, 724, 725, and 726.

The increase in unsatisfied checks is more often upon decoding failure within the maximum decoding count than upon decoding success within the maximum decoding count. The increase in unsatisfied checks occurs upon message truncation and when errors are not corrected due to the trapping sets present in the code.

Figure 8:
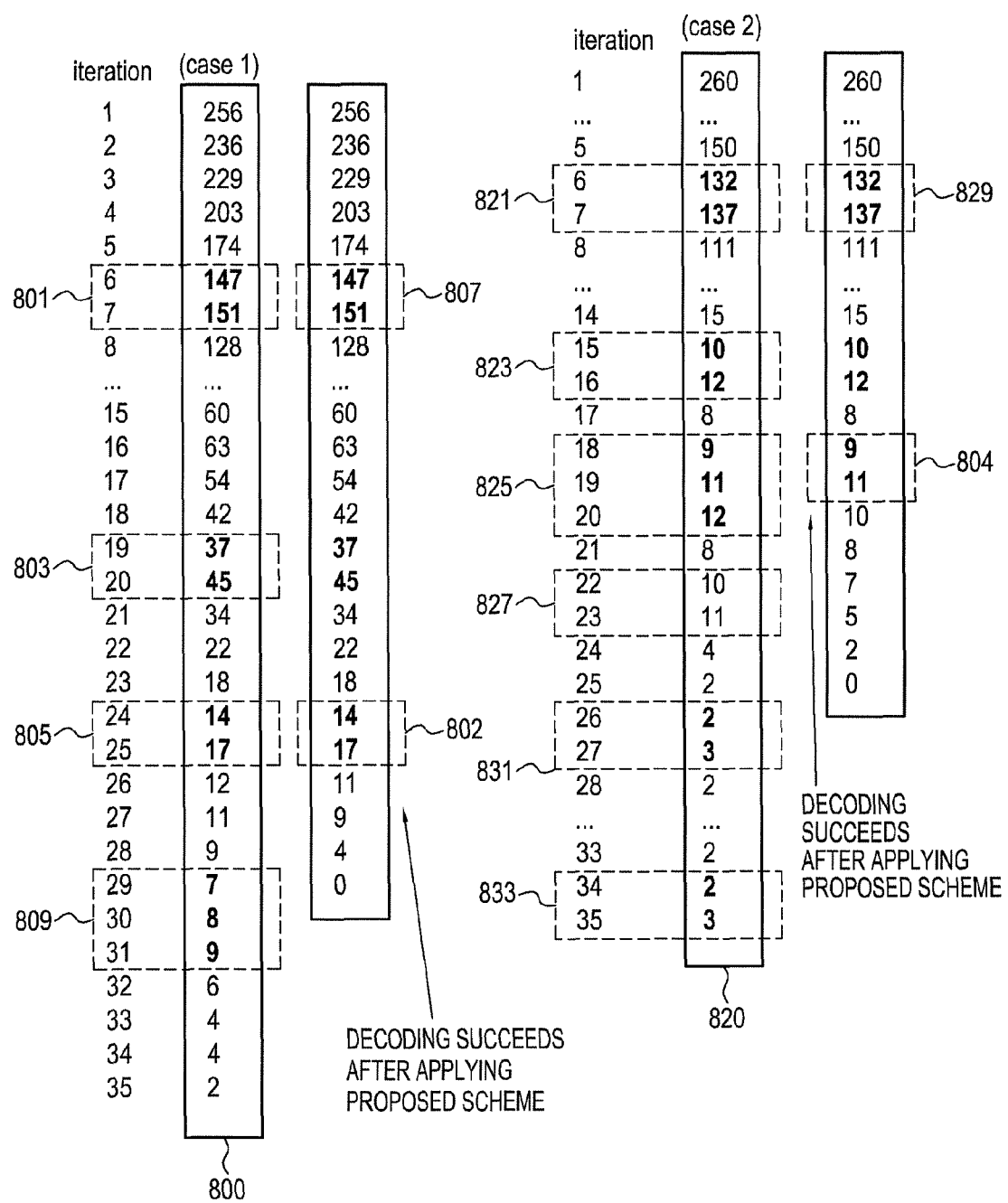
FIG. 8 illustrates an example of error correction in a mobile communication system adopting a non-binary LDPC code according to various embodiments of the present disclosure.

FIG. 8 illustrates an example of error correction in a mobile communication system adopting a non-binary LDPC code according to various embodiments of the present disclosure.

Referring to FIG. 8, reference numeral 802 in case 1 800 represents an example of decoding success achieved by adjusting the size (nm) of a related parity check input message with respect to the number (such as 3) of the increases in unsatisfied checks. Referring to FIG. 8, reference numeral 804 in case 2 820 represents an example of decoding success achieved by adjusting the size (nm) of a related parity check input message with respect to the number (such as 3) of the increases in unsatisfied checks.

As indicated by reference numerals 801, 802, 803, 805, 807, and 809 in case 1 800 of FIG. 8, errors are corrected by increasing the size (nm) of the message input to the check node for the parity checks with the number of the increases in unsatisfied checks, caused by the increase in the iteration count, not less than 2 (803) or 3 (805 or 802).

As indicated by reference numerals 821, 823, 825, 827, 381, 831, 833, 829, and 804 in case 2 820 of FIG. 8, errors are corrected by increasing the size (nm) of the message input to the check node for the parity checks with the number of the increases in unsatisfied checks, caused by the increase in the iteration count, not less than 2 (823) or 3 (825 or 804).

In contrast, when the iteration decoding is infrequent within the maximum iteration count and the "unsatisfied check=0," the decoding computation count and the decoding delay are reduced by increasing the truncation count of the input message (by reducing nm). The time when nm adjustment applies depending on the number of the increases in unsatisfied checks is determined depending on at least one of the maximum iteration count and the code rate. Typically, when the maximum iteration count is 30 or more, nm adjustment applies from the time when the increases in unsatisfied checks are discovered two, three or more times. However, according to various embodiments of the present disclosure, when the maximum iteration count is less than 30, the time of applying nm adjustment is determined considering 1) when the number of the increases in unsatisfied checks is 1, 2) unsatisfied checks value, and 3) the remaining iteration count values at the time of applying the message size adjustment.

FIG. 9 illustrates an example of adjusting nm when the maximum iterative decoding count=20, according to various embodiments of the present disclosure.

Case 2 920 of FIG. 9 indicates when the number of the increases in unsatisfied checks is 0. In contrast, case 1 910 and case 3 930 of FIG. 9, when the iterative decoding count is 15, satisfy the number of the increases in unsatisfied checks being one, indicated by 912 and 932. Considering the remaining iteration count for case 1 910, since the unsatisfied checks value is 9, error correction is done by increasing nm within the period of the remaining iteration count. Case 3 930 exhibits an unsatisfied checks value of 14, which is more than case 1 910, and for case 3 930, an nm value further increased than nm value in case 1 910 is used to correct errors within the period of the maximum iterative decoding count. Case 3 930 illustrates certain embodiments when applying the same increase in nm as case 1 910.

Figure 10:
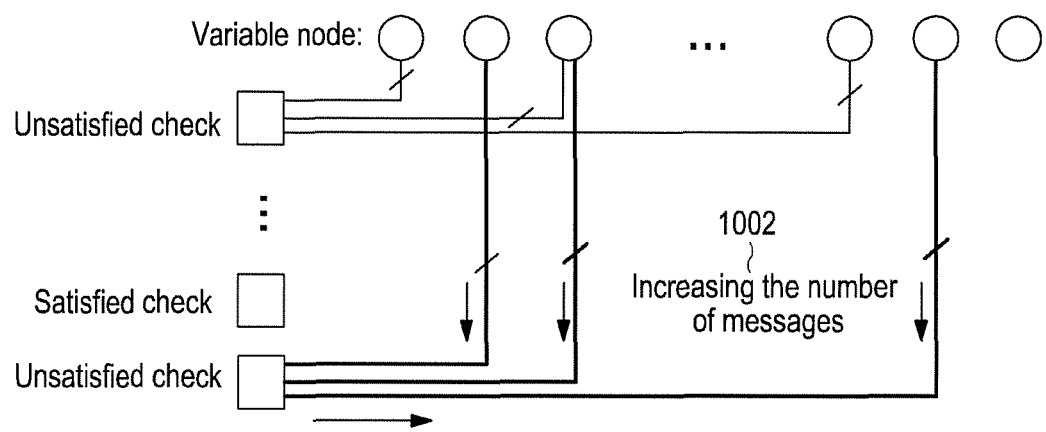
FIG. 10 illustrates a specific operation according to a various embodiments of the present disclosure.

FIG. 10 illustrates a specific operation according to a various embodiments of the present disclosure.

The counter of the receiver, not shown in the figure, counts the number of the increases in unsatisfied checks as the iteration count increases. When the number of the increases in unsatisfied checks is two, three or more, the controller of the receiver, not shown in the figure, increases the size of the input message of a specific unsatisfied check (operation 1002 of FIG. 10). Errors are corrected within the remaining period of iteration count by increasing the message size. Further, errors are corrected within the period of the maximum iterative decoding count by increasing the message size. Thereafter, the controller of the receiver varies the scaling of the message output from the check node according to the size of the message input to the check node.

Figure 11:
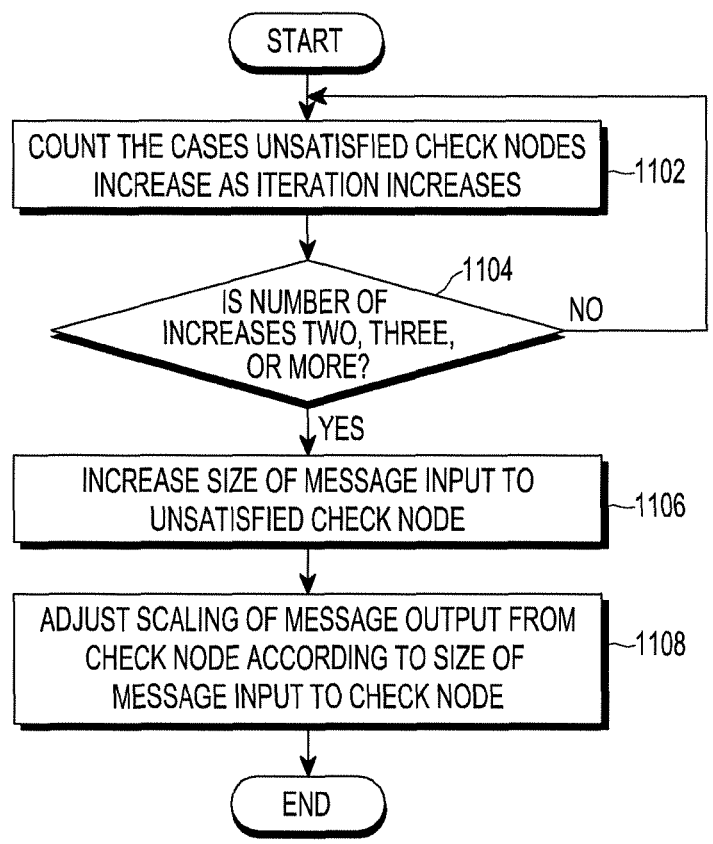
FIG. 11 illustrates an error correction method in a mobile communication system adopting a non-binary LDPC code according to various embodiments of the present disclosure.

FIG. 11 illustrates an error correction method in a mobile communication system adopting a non-binary LDPC code according to various embodiments of the present disclosure.

In step 1102, the receiver counts the number of the increases in unsatisfied checks as iterative decoding count increases. In step 1104, the receiver determines whether the number of the increases in unsatisfied checks is, for example, two or three. Unless the number of the increases in unsatisfied checks is two or three, the receiver goes back to step 1102. In step 1106, when the number of the increases in unsatisfied checks is two or three, the receiver increases the size of an input message of unsatisfied checks. The time of increasing the size of the input message is determined as, for example, when the number of the increases in unsatisfied checks is two or three. In certain embodiments, the time of increasing the size of the input message, when the maximum iteration count is less than 30, is determined when the number of the unsatisfied check nodes is 1. In certain embodiments, the time of increasing the size of the input message is determined considering the remaining iteration count values at the time of applying adjustment of the number of messages.

In step 1108, the receiver adjusts the scaling of the message output from the check node according to the size of the message input to the check node. According to various embodiments of the present disclosure, the receiver reduces decoding failure and average iteration count. As the average iteration count reduces, the receiver reduces power consumption.

Figure 12:
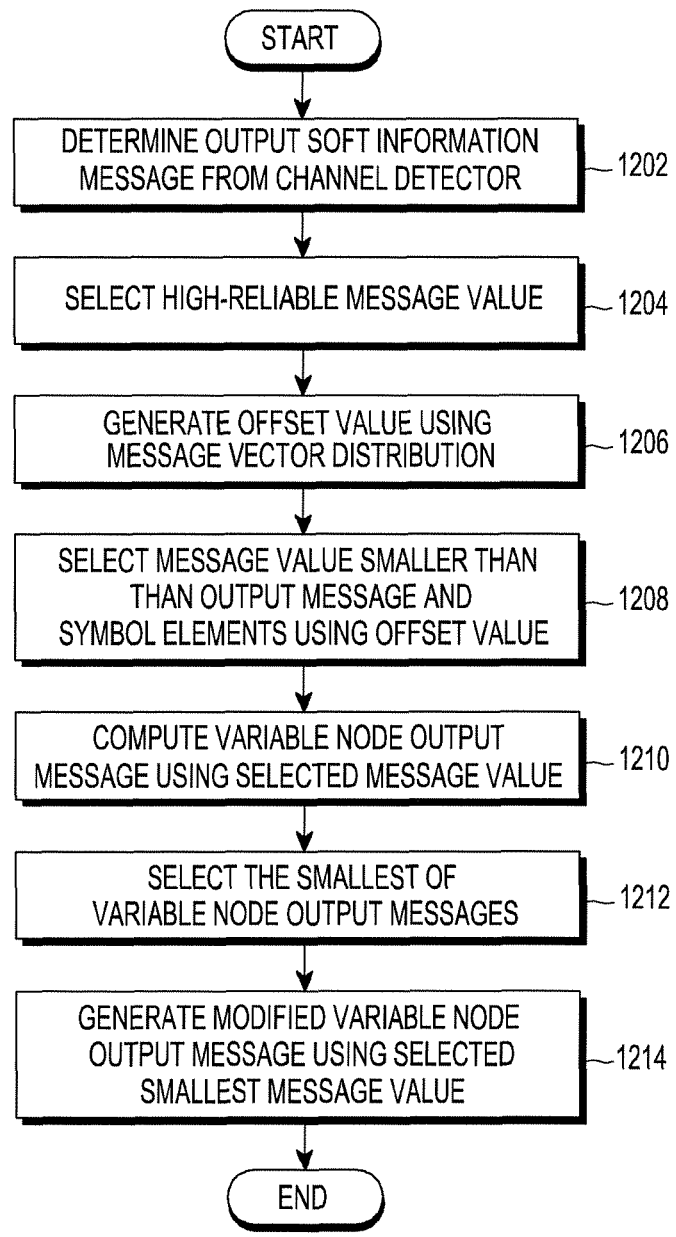
FIG. 12 illustrates an error correction method in a mobile communication system adopting a non-binary LDPC code according to various embodiments of the present disclosure.

FIG. 12 illustrates an error correction method in a mobile communication system adopting a non-binary LDPC code according to various embodiments of the present disclosure.

The operation of FIG. 12, although illustrated to be performed by a decoder, can be performed by a controller of the receiver. Further, the operation of FIG. 12 can be performed by the message estimating unit 1408, message converting unit 1404, first message selecting unit 1406, check node message generating unit 1410, second message selecting unit 1412, variable node message generating unit 1416, and post-processing unit 1414 shown in FIG. 14 that is described below.

In step 1202, the decoder determines an output soft information message (or soft information) of a channel detector and obtains the information, such as the length of data, modulation scheme, and encoding rate, that is transmitted from the transmitter. In step 1204, the decoder selects the message value with the highest reliability among each message vector.

For example, for the message vector with the GF 32 code, the maximum value is chosen from among the values corresponding to 32 symbol elements. For the first symbol, the maximum value is computed as Max=maximum {Probability[0], Probability[1], ..., Probability[$\alpha^{30}$]}. Accordingly, the output message at step 1204 is {Max-Probability [0], Max-Probability[1], ..., Max-Probability[$\alpha^{30}$]}. In step 1206, an offset value is generated using a distribution (average or dispersion) of the message vectors from the above operations. The generated offset value includes the one variable depending on at least one of the data characteristics (size of codeword or M) and the modulation scheme determined by the transmitter. In step 1208, the decoder selects the message value smaller than the message value output at step 1204 and symbol elements using the offset value generated by the value having the message vector distribution. At step 1210, the decoder computes a variable node output message (V2C message: variable-to-check message) using the selected message value. The variable node generation scheme is similar to the variable node generation scheme of a typical message passing algorithm.

In step 1212, the decoder selects the smallest message of the variable node output messages. In step 1214, the decoder generates a modified variable output message using the variable node output messages and the selected smallest message.

After generating the variable node output message, a check node output message (C2V message: check-to-variable message) should be computed. The check node output message is subjected to a similar scheme to that of computing a variable node output message (such as steps 1206, 1208, and 1212), and thus, no detailed description thereof is made. Further, the check node generation scheme is similar to the check node generation scheme of a typical message passing algorithm. After generating the check node output message, the variable node output message is generated.

Figure 13:
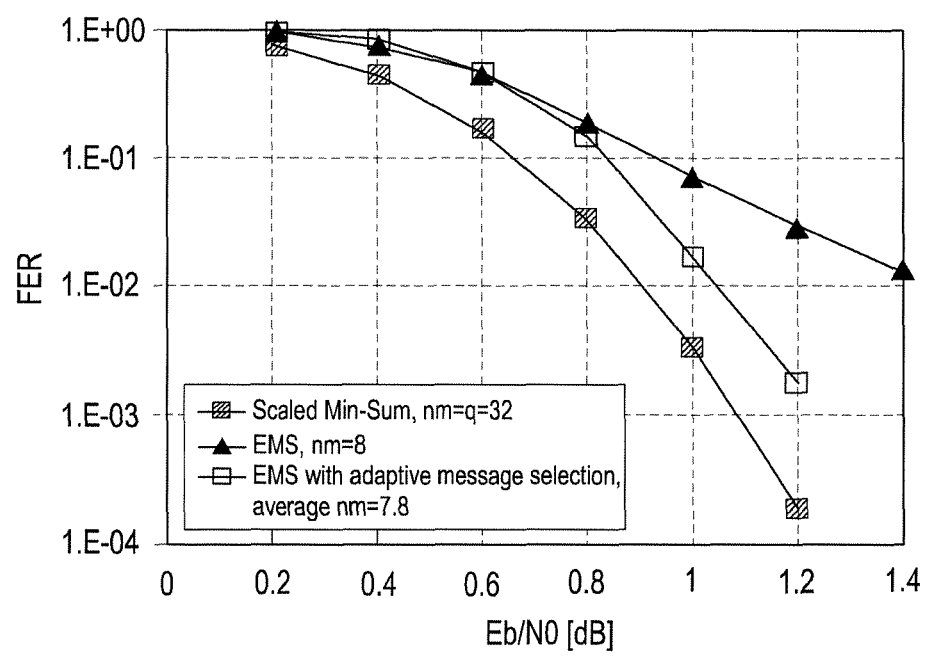
FIG. 13 illustrates a result of decoding performance obtained according to a varying nm value in case the message size adjusting scheme applies when the number of the increases in unsatisfied checks is two, according to various embodiments of the present disclosure.

FIG. 13 illustrates a result of decoding performance obtained according to a varying nm value in case the message size adjusting scheme applies when the number of the increases in unsatisfied checks is two, according to various embodiments of the present disclosure.

FIG. 13 is a graph illustrating a result of decoding performance depending on a varying nm value in the case of GF 32, K being 960, code rate being 1/3, and the maximum iteration count being 35.

Referring to FIG. 13, the method according to various embodiments of the present disclosure, when adopted in algorithms (EMS with adaptive message selection), offers the advantages over existing schemes (extended Min-Sum (EMS)), such as an 0.4 dB performance enhancement with respect to frame error rate (FER)=0.01 and no occurrence of error floor. In other words, the present method provides a performance enhancement of 0.4 dB or more in high SNR regions.

Figure 14:
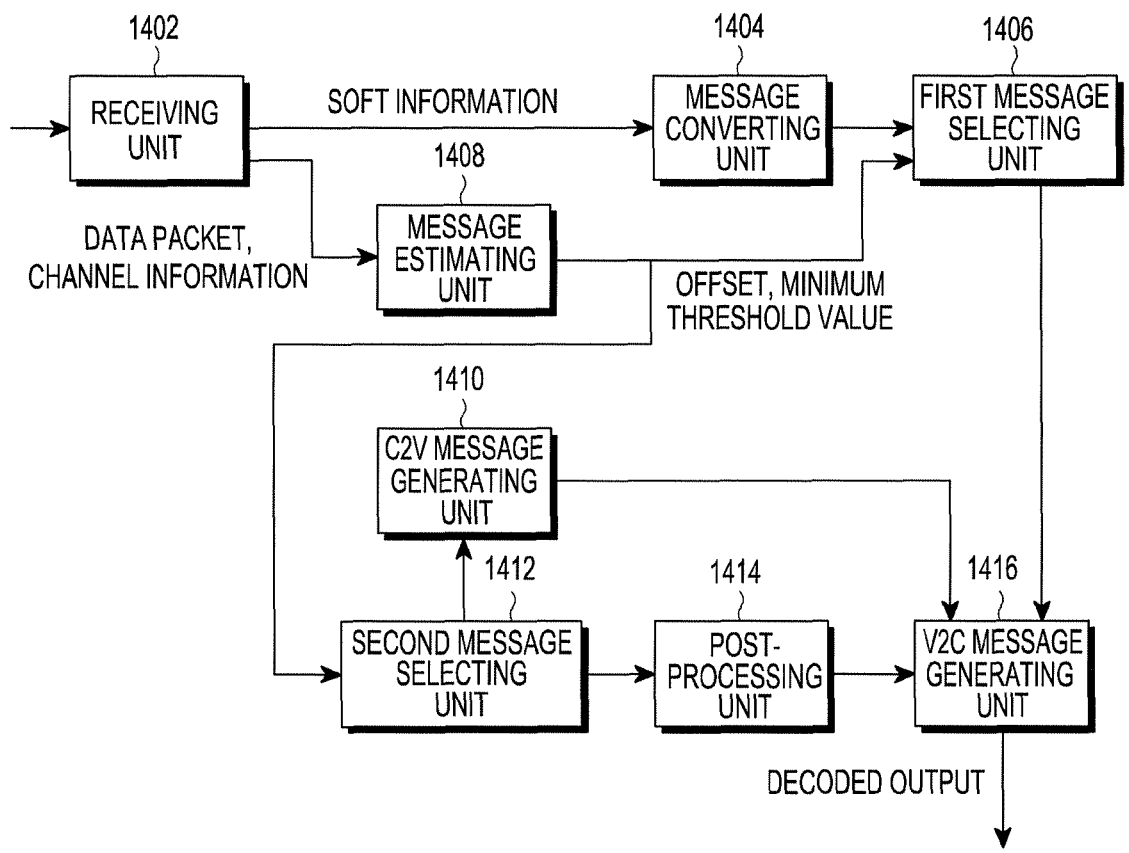
FIG. 14 illustrates the structure of a non-binary LDPC decoder according to various embodiments of the present disclosure.

FIG. 14 illustrates the structure of a non-binary LDPC decoder according to various embodiments of the present disclosure.

The non-binary LDPC code decoder according to the present disclosure includes a receiving unit 1402, a message estimating unit 1408, a message converting unit 1404, a first message selecting unit 1406, a check node message generating unit 1410, a second message selecting unit 1412, a variable node message generating unit 1416, and a post-processing unit 1414.

The output message from the check node message generating unit 1410 is represented as a C2V message, and the output message from the variable node message generating unit 1416 is represented as a V2C message.

The message estimating unit 1408 generates an offset value and a minimum threshold value using a distribution (average or dispersion) of message vectors.

The message converting unit 1404 selects the message value with the highest reliability within the message vectors from the soft information determined by the receiving unit 1402.

The first message selecting unit 1406 selects the message value smaller than the output message with the highest reliability and symbol elements using the offset value generated by the value having the message vector distribution. The first message selecting unit 1406 applies to both the variable node output message and the check node output message.

The second message selecting unit 1412 selects the smallest message of the variable node output messages.

The variable node message generating unit 1416 generates the variable node output message, and the post-processing unit 1414 performs a post-process on the generated variable node output message.

The check node message generating unit 1410 generates the check node output message.

Figure 15:
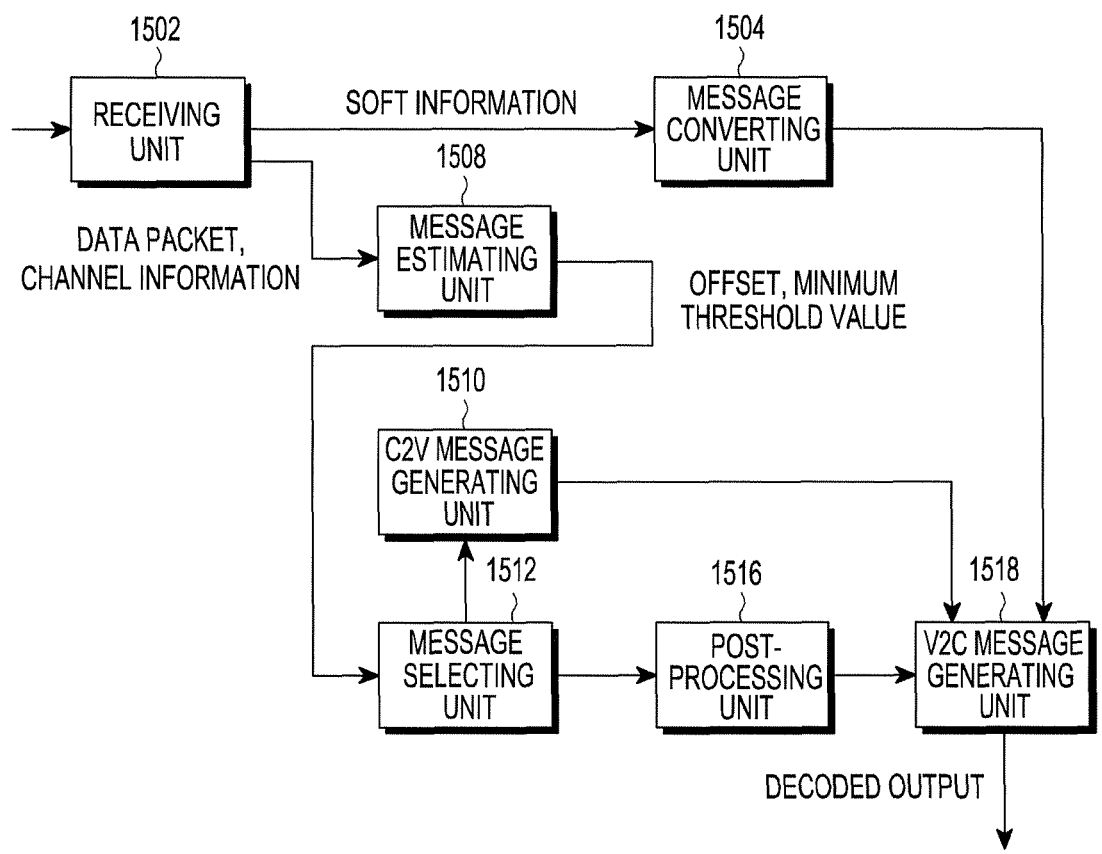
FIG. 15 illustrates the structure of an non-binary LDPC decoder according to various embodiments of the present disclosure.

FIG. 15 illustrates the structure of a non-binary LDPC decoder with a non-binary LDPC decoding scheme according to another embodiment of the present disclosure.

FIG. 15, as compared with FIG. 14, illustrates only one message selecting unit. Each function is the same as those illustrated in FIG. 14.

The message estimating unit 1508 of FIG. 15 references the SNR and MCS index to select a high-reliable message of the CVC input messages input to the decoder.

In certain embodiments, the message estimating unit 1508 of FIG. 14 selects a high-reliable message of the CVC input message and the V2C input message.

The decoder of FIG. 14 includes two message selecting units and provides reduced complexity in structure and decreased power consumption as compared with the decoder of FIG. 15. However, the decoder of FIG. 14 has a lower error correction performance than the decoder of FIG. 15. The decoder of FIG. 14 or the decoder of FIG. 15 is selectively used depending on the system requirements of the receiver (such as error correction performance, complexity, power consumption, etc.).

Figure 16:
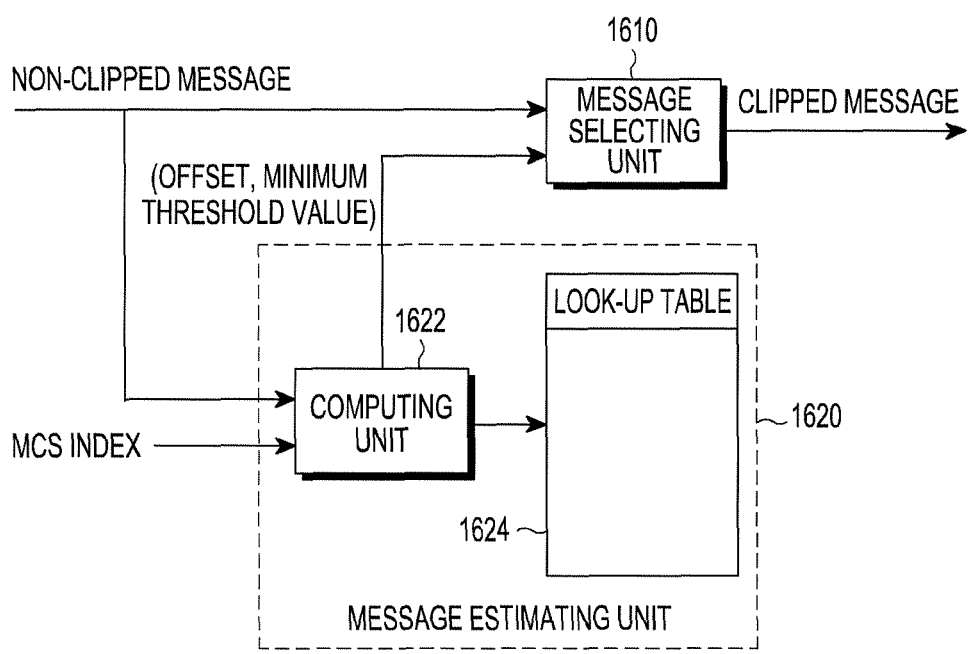
FIG. 16 illustrates the detailed structure of a message estimating unit as shown in FIGS. 14 and 15 according to various embodiments of the present disclosure.

FIG. 16 illustrates the detailed structure of a message estimating unit as shown in FIGS. 14 and 15 according to various embodiments of the present disclosure.

The message estimating unit 1620 includes a computing unit 1622 and a look-up table 1620.

The computing unit 1622 computes the offset value and the minimum threshold value information according to the look-up table 1620 using the distribution (average or dispersion) of non-clipped messages and modulation and coding scheme (MCS) index information and transmits the offset value and minimum threshold value information to the message selecting unit 1610.

The message selecting unit 1610 converts the non-clipped message into a clipped message using the offset value and the minimum threshold received from the computing unit 1622 and outputs the clipped message.

Table 1 below represents an example of determining the offset value and the minimum threshold value according to the above-described MCS index information.

TABLE 1

| MCS Index | Modulation scheme | Code Rate | Offset value | Minimum threshold value |
|---|---|---|---|---|
| ... | | | | |
| 3 | 16-QAM | 1/2 | 0 | 25 |
| 4 | 16-QAM | 3/4 | 0.5 | 20 |
| 5 | 64-QAM | 2/3 | 0.5 | 20 |
| 6 | 64-QAM | 3/4 | 1.0 | 15 |
| 7 | 64-QAM | 5/6 | 1.5 | 10 |
| ... | | | | |

The error correction apparatus and method in the mobile communication system using a non-binary LDPC code, according to various embodiments of the present disclosure, be implemented in hardware, software, or a combination of hardware and software. The software is stored in a machine (such as a computer)-readable storing medium while simultaneously able to be recorded in, for example, a read only memory (ROM) or other volatile or non-volatile storage device, a memory, such as a random access memory (RAM), a memory chip, a device, or an integrated circuit (IC), or an optical or magnetic storage device, such as a compact disc (CD), a digital video disc (DVD), a magnetic disc, or a magnetic tape. The error correction method in the mobile communication system using a non-binary LDPC code according to various embodiments of the present disclosure is implemented by a computer or portable terminal including a controller and a memory, and the memory is an example of a storage medium that is read out by a machine appropriate to store a program or programs including instructions for realizing the embodiments of the present disclosure.

Accordingly, the present disclosure encompasses a program containing codes for implementing the apparatus or method set forth in the claims of this disclosure and a machine (such as computer)-readable storage medium storing the program. The program is electronically transferred via any media such as communication signals transmitted through a wired or wireless connection and the present disclosure properly includes the equivalents thereof.

The error correction apparatus in the mobile communication system using a non-binary LDPC code according to various embodiments of the present disclosure receives the program from a program providing device wiredly or wirelessly connected thereto and store the same. The program providing device includes a memory for storing a program including instructions enabling the program providing device to perform the error correction method in the mobile communication system using the non-binary LDPC code using a preset non-binary LDPC code and information necessary for the error correction method in the mobile communication system using the non-binary LDPC code, a communication unit for wiredly or wirelessly communicating with the graphic processing device, and a controller transmitting the program to the communication device automatically or in response to a request from the graphic processing device.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for correcting an error in a mobile communication system using a non-binary low density parity check (LDPC) code, the method comprising:
   receiving a signal transmitted from a transmitter; and
   performing iterative decoding on the received signal,
      wherein performing the iterative decoding includes:
         counting a number of increases in unsatisfied check nodes as a function of an increase in an iterative decoding count; and
         increasing a size of messages input to the unsatisfied check nodes if the number of the increases of the unsatisfied check nodes is equal to a predetermined number, and
      wherein the size of the messages input to the unsatisfied check nodes is increased based on a maximum count of the iterative decoding and a number of the unsatisfied check nodes.

2. The method of claim 1, wherein a time of adjusting the size of the messages input is determined if the predetermined number is two or three.

3. The method of claim 1, wherein a time of adjusting the size of the messages input is determined if the number of the increases of the unsatisfied check nodes is one and the maximum decoding iteration count is less than 30.

4. The method of claim 1, wherein a time of adjusting the size of the messages input is determined considering a remaining iteration count value at a time of applying an adjustment of a number of messages.

5. The method of claim 1, wherein a time of adjusting the size of the messages input is determined as a function of at least one of the maximum decoding iteration count and a code rate.

6. The method of claim 1, wherein the messages input are selected based on an offset value and a minimum threshold value, wherein the offset value, and the minimum threshold value are selected based on channel state information on the received signal, and a message vector value and a symbol are selected based on the offset value and the minimum threshold value.

7. The method of claim 1, wherein the performing the iterative decoding further includes:
   adjusting a scaling of a message output as a function of the size of the message input to the unsatisfied check node.

8. The method of claim 1, wherein the size of the messages input to the unsatisfied check nodes is adjusted to be increased proportionally to the number of the unsatisfied check nodes.

9. The method of claim 1, wherein the size of the messages input to the unsatisfied check nodes is adjusted to be increased inversely proportionally to the maximum count of the iterative decoding.

10. An apparatus for correcting an error in a mobile communication system using a non-binary low density parity check (LDPC) code, the apparatus comprising:
   a counter configured to count a number of increases of unsatisfied checks nodes as a function of an increase in an iterative decoding count; and a controller configured to increase a size of messages input to the unsatisfied check nodes if the number of the increases of the unsatisfied check nodes is equal to a predetermined number, wherein the size of the messages input to the unsatisfied check nodes is increased based on a maximum of the iterative decoding count and a number of the unsatisfied check nodes.

11. The apparatus of claim 10, wherein a time of adjusting the size of the messages is determined if the predetermined number is two or three.

12. The apparatus of claim 10, wherein a time of adjusting the size of the messages is determined if the number of the increases of the unsatisfied check nodes is one and the maximum decoding iteration count is less than 30.

13. The apparatus of claim 10, wherein a time of adjusting the size of the messages is determined considering a remaining iteration count value at a time of applying an adjustment of a number of messages.

14. The apparatus of claim 10, wherein a time of adjusting the size of the messages is determined as a function of at least one of the maximum decoding iteration count and a code rate.

15. The apparatus of claim 10, wherein the messages input are selected based on an offset value and a minimum threshold value, wherein the offset value and the minimum threshold value are selected based on channel state information on a received signal, and a message vector value and a symbol are selected based on the offset value and the minimum threshold value.

16. The apparatus of claim 10, wherein the controller is configured to adjust a scaling of a message output as a function of the size of the message input to the unsatisfied check node.

17. The apparatus of claim 10, wherein the size of the messages input to the unsatisfied check nodes is adjusted to be increased proportionally to the number of the unsatisfied check nodes.

18. The apparatus of claim 10, wherein the size of the messages input to the unsatisfied check nodes is adjusted to be increased inversely proportionally to the maximum of the iterative decoding count.

* * * * *